(12) United States Patent
Zhang et al.

(10) Patent No.: US 12,166,190 B2
(45) Date of Patent: Dec. 10, 2024

(54) COOLING DEVICE FOR POWER BATTERY SYSTEM, POWER BATTERY SYSTEM AND VEHICLE

(71) Applicant: Webasto SE, Stockdorf (DE)

(72) Inventors: Qing Zhang, Shanghai (CN); Shaochun Shi, Shanghai (CN); Qiuhua Li, Shanghai (CN)

(73) Assignee: WEBASTO SE, Stockdorf (DE)

( * ) Notice: Subject to any disclaimer, the term of this patent is extended or adjusted under 35 U.S.C. 154(b) by 667 days.

(21) Appl. No.: 17/416,208

(22) PCT Filed: Dec. 23, 2019

(86) PCT No.: PCT/CN2019/127613
§ 371 (c)(1),
(2) Date: Jun. 18, 2021

(87) PCT Pub. No.: WO2020/125805
PCT Pub. Date: Jun. 25, 2020

(65) Prior Publication Data
US 2022/0149453 A1    May 12, 2022

(30) Foreign Application Priority Data

Dec. 21, 2018 (CN) .......................... 201822163284.2

(51) Int. Cl.
*H01M 10/613*    (2014.01)
*B60L 50/64*     (2019.01)
(Continued)

(52) U.S. Cl.
CPC .......... *H01M 10/613* (2015.04); *B60L 50/64* (2019.02); *B60L 58/26* (2019.02); *H01M 10/625* (2015.04);
(Continued)

(58) Field of Classification Search
CPC ............. H01M 10/613; H01M 10/625; H01M 10/6554; H01M 10/6556; H01M 10/6568;
(Continued)

(56) References Cited

U.S. PATENT DOCUMENTS

| | | | |
|---|---|---|---|
| 2012/0107663 A1* | 5/2012 | Burgers | ............ H01M 10/6556 429/120 |
| 2015/0082821 A1 | 3/2015 | Ganz et al. | |

(Continued)

FOREIGN PATENT DOCUMENTS

| | | |
|---|---|---|
| CN | 206388826 U | 8/2017 |
| CN | 206412444 U | 8/2017 |

(Continued)

OTHER PUBLICATIONS

International Search Report and Written Opinion for PCT/CN2019/127613, mailed Mar. 24, 2020.

*Primary Examiner* — James M Erwin
(74) *Attorney, Agent, or Firm* — Concept IP LLP; Michael Zarrabian

(57) ABSTRACT

The present disclosure relates to a cooling device for a power battery system, a power battery system for a vehicle comprising the cooling device, and a vehicle. The cooling device is disposed at a bottom of the power battery system and includes a chamber defined by a casing. The chamber includes: a first region where a liquid cooling plate assembly is disposed; and a second region sealingly separated from the first region and accommodating a piping system for coolant communication. The liquid cooling plate assembly extends from a bottom of the first region to a bottom of the second region, and the piping system is in fluid communication with a flow passage of the liquid cooling plate assembly. In the cooling device of the present disclosure, the piping system is all disposed outside the battery system. Thus, battery cells or high-voltage devices inside the battery (Continued)

system would not be affected even if the coolant leaks at the piping system, which greatly improves safety of the battery system.

9 Claims, 3 Drawing Sheets

(51) Int. Cl.
| | |
|---|---|
| *B60L 58/26* | (2019.01) |
| *H01M 10/625* | (2014.01) |
| *H01M 10/6554* | (2014.01) |
| *H01M 10/6556* | (2014.01) |
| *H01M 10/6568* | (2014.01) |
| *H05K 7/20* | (2006.01) |

(52) U.S. Cl.
CPC ..... *H01M 10/6554* (2015.04); *H01M 10/6556* (2015.04); *H01M 10/6568* (2015.04); *H05K 7/20872* (2013.01); *H01M 2220/20* (2013.01)

(58) Field of Classification Search
CPC ........... H01M 2220/20; H05K 7/20872; B60L 60/64; B60L 58/26
USPC ........................................................ 429/120
See application file for complete search history.

(56) References Cited

U.S. PATENT DOCUMENTS

| | | | | |
|---|---|---|---|---|
| 2016/0372805 | A1* | 12/2016 | Kim | H01M 50/204 |
| 2018/0097265 | A1* | 4/2018 | Tarlau | H01M 10/613 |

FOREIGN PATENT DOCUMENTS

| | | | | |
|---|---|---|---|---|
| CN | 107331812 | A | 11/2017 | |
| CN | 108039536 | A | 5/2018 | |
| CN | 109037500 | A * | 12/2018 | ......... H01M 2/0237 |
| CN | 109037540 | A * | 12/2018 | ......... H01M 10/613 |
| CN | 209119276 | U | 7/2019 | |

* cited by examiner

COOLING DEVICE FOR POWER BATTERY SYSTEM, POWER BATTERY SYSTEM AND VEHICLE

CROSS-REFERENCE TO RELATED APPLICATIONS

This application is a 35 U.S.C § 371 National Stage Entry of International Application No. PCT/CN2019/127613, filed Dec. 23, 2019, which claims the priority benefit of China Patent Application Number 201822163284.2, filed Dec. 21, 2018, all of which are incorporated herein by reference in their entirety for all purposes.

TECHNICAL FIELD

The present disclosure generally relates to the field of vehicles, in particular to the field of power battery systems of new energy vehicles (electric vehicles, hybrid vehicles). More particularly, the present disclosure relates to a cooling device for a power battery system, a power battery system for a vehicle, and a vehicle having a power battery system.

BACKGROUND

Hybrid vehicles and pure electric vehicles typically require a highly efficient power battery system to provide energy. When the power battery system is operated at high power, charging and discharging processes of batteries produce a large amount of heat, causing heat buildup inside the batteries and causing degradation of battery performance. Since the power batteries are sensitive to temperature, in order to enable the power batteries to operate at an optimum temperature (15~35° C.), more and more battery systems are equipped with cooling systems based on air cooling or liquid cooling. Since the air cooling has a low heat transfer coefficient and a slow heat transfer rate, liquid cooling system is most commonly used. However, there is a risk of coolant leakage in the liquid cooling system, which may cause the battery system to short circuit, catch fire or even explode.

SUMMARY OF THE DISCLOSURE

An object of the present disclosure is to overcome above problems to avoid a safety risk caused by the coolant leakage. By designing a cooling device for a power battery system with an external cooling piping, high-voltage devices and modules inside the battery system would not be affected even if the coolant leaks, which greatly improves safety.

To this end, according to an aspect of the present disclosure, a cooling device for a power battery system is provided. The cooling device is disposed at a bottom of the power battery system and includes a chamber defined by a casing. The chamber includes: a first region where a liquid cooling plate assembly is disposed; and a second region sealingly separated from the first region and accommodating a piping system for coolant communication. The liquid cooling plate assembly extends from a bottom of the first region to a bottom of the second region, and the piping system is in fluid communication with a flow passage of the liquid cooling plate assembly.

According to the above technical concept, the present disclosure may further include any one or more of the following optional embodiments.

In some optional embodiments, the liquid cooling plate assembly includes a plurality of liquid cooling plates arranged side by side and sealingly connected with each other, and one or more adjacent liquid cooling plates are in fluid communication to form a cooling circuit.

In some optional embodiments, sides of the one or more liquid cooling plates constituting the cooling circuit are provided with slots to achieve a fluid communication between the liquid cooling plates, and the slots are disposed at the second region.

In some optional embodiments, the piping system includes a liquid inlet pipe and a liquid outlet pipe. The liquid inlet pipe is in fluid communication with one or more liquid cooling plates and connected to a liquid supply pipe via a liquid inlet joint, and the liquid outlet pipe is in fluid communication with one or more liquid cooling plates and connected to a liquid discharge pipe via a liquid outlet joint.

In some optional embodiments, the first region is defined by a plurality of vertical plates perpendicular to the liquid cooling plate assembly; the plurality of vertical plates are sealingly connected to the liquid cooling plate assembly; and the power battery system is disposed in the first region and supported by the liquid cooling plate assembly.

In some optional embodiments, the second region is sealingly separated from the first region by the vertical plate, and the second region further includes an enclosure side plate through which the piping system extends and/or a cover plate.

In some optional embodiments, the plurality of liquid cooling plates are sealingly connected by friction stir welding or metal inert-gas welding.

According to another aspect of the present disclosure, a power battery system for a vehicle is provided. The power battery system includes at least one cooling device as mentioned above.

According to still another aspect of the present disclosure, a vehicle is provided. The vehicle includes a power battery system, and the power battery system includes at least one cooling device as mentioned above.

In the cooling device of the present disclosure, the piping system is all disposed outside the battery system. Thus, battery cells or high-voltage devices inside the battery system would not be affected even if the coolant leaks at the piping system, which greatly improves safety of the battery system. Moreover, the liquid cooling plates of the liquid cooling plate assembly can be flexibly arranged in series and parallel connection, so that the flow distribution of the liquid cooling plates can be reasonably adjusted, which helps to reduce temperature differences between the battery cells, improve the performance of the battery system, and prolong the service life of the battery cells. In addition, the length and complexity of liquid cooling piping can be greatly reduced, which helps to reduce failure risk and cost.

BRIEF DESCRIPTION OF THE DRAWINGS

Other features and advantages of the present disclosure will be better understood from the following detailed description of optional embodiments with reference to the drawings, wherein same reference numerals in the drawings identify the same or similar parts. In the drawings.

DETAILED DESCRIPTION

The implementation and application of the embodiments are discussed in detail below. It should be understood, however, that the specific embodiments of the present disclosure are only illustrative of specific ways to implement and apply the present disclosure without limiting the scope of the present disclosure. The representations of structural positions of various components, such as up, down, top, bottom, etc., in the description are not absolute, but rather relative. These orientation representations are appropriate when the various components are arranged as shown in the figures, but when the positions of the various components in the figures change, these orientation representations also change accordingly.

Generally, a power battery system for a vehicle includes a battery pack composed of a plurality of battery cells, and a cooling device is disposed at a bottom of the power battery system to help to quickly and evenly dissipate heat from the battery pack. To avoid the risk of coolant leakage, the cooling device according to the present disclosure is advantageously configured to have a chamber defined by a casing. The chamber includes: a first region where a liquid cooling plate assembly is disposed; and a second region which is sealingly separated from the first region and accommodates a piping system for coolant communication.

Figure 1:
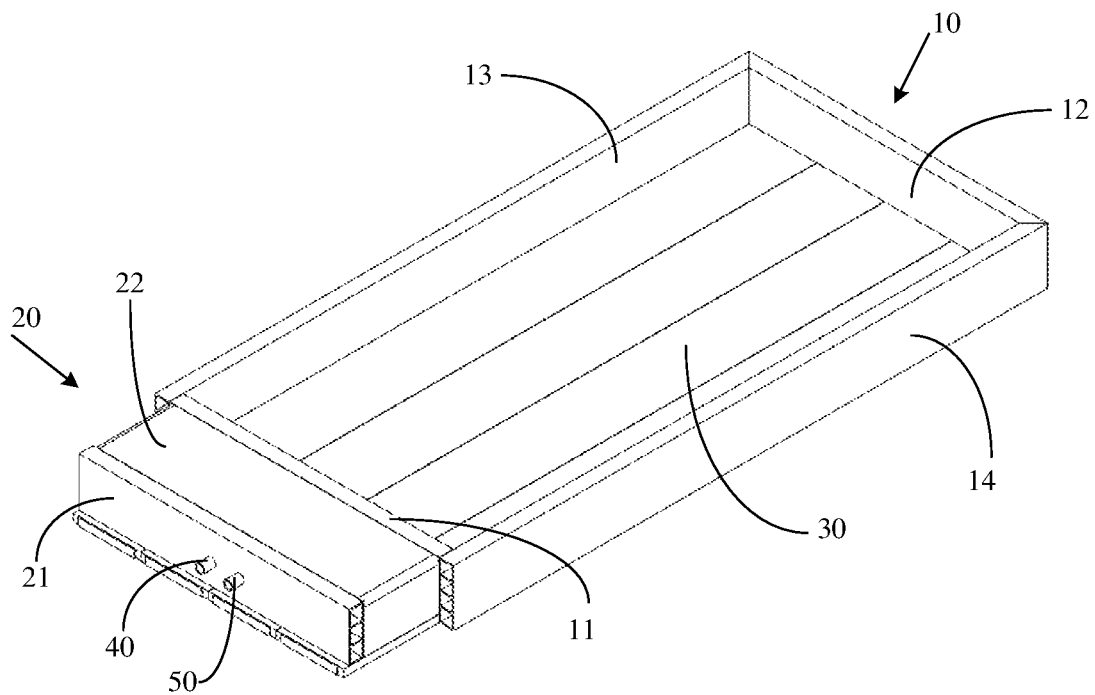
FIG. 1 is a schematic view of a cooling device for a power battery system according to an embodiment of the present disclosure.
Figure 2:
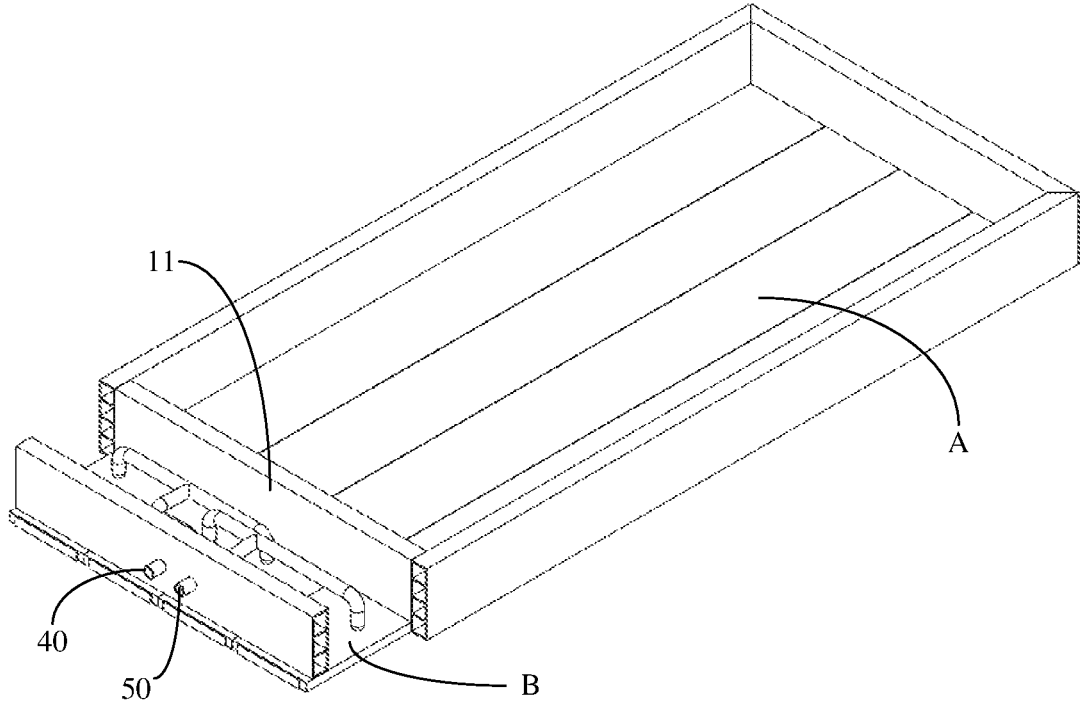
FIG. 2 is a schematic view of the cooling device similar to FIG. 1, with a cover plate in a second region removed.

In the embodiment shown in FIGS. 1 to 6, the first region 10 and the second region 20 are adjacent and separated from each other. The liquid cooling plate assembly 30 extends from a bottom of the first region 10 to a bottom of the second region 20. Piping system 40, 50 is in fluid communication with flow passages of the liquid cooling plate assembly 30 and disposed in the second region 20. According to some embodiments, the first region 10 is defined by a plurality of vertical plates perpendicular to the liquid cooling plate assembly 30, and the plurality of vertical plates are sealingly connected to the liquid cooling plate assembly 30. For example, a front plate 11, a rear plate 12 and two side plates 13, 14 are shown in the orientation of FIG. 1, thereby defining a first chamber A for accommodating the power battery system, and the liquid cooling plate assembly 30 as a bottom plate provides support for the power battery system, while effectively ensuring heat transfer area. The front plate 11 sealingly separates the first region 10 from the second region 20. The second region 20 may also include enclosure side plates and a cover plate 22. A front enclosure side plate 21 is exemplarily shown in FIG. 1. In some embodiments, the second region 20 may also include enclosure side plates located at two sides and connected with the two side plates 13, 14 of the first region 10, thereby defining a second chamber B for accommodating the piping system 40, 50 for coolant communication. FIG. 2 shows the piping system 40, 50 disposed in the second region 20 by the removal of the cover plate 22.

Figure 3:
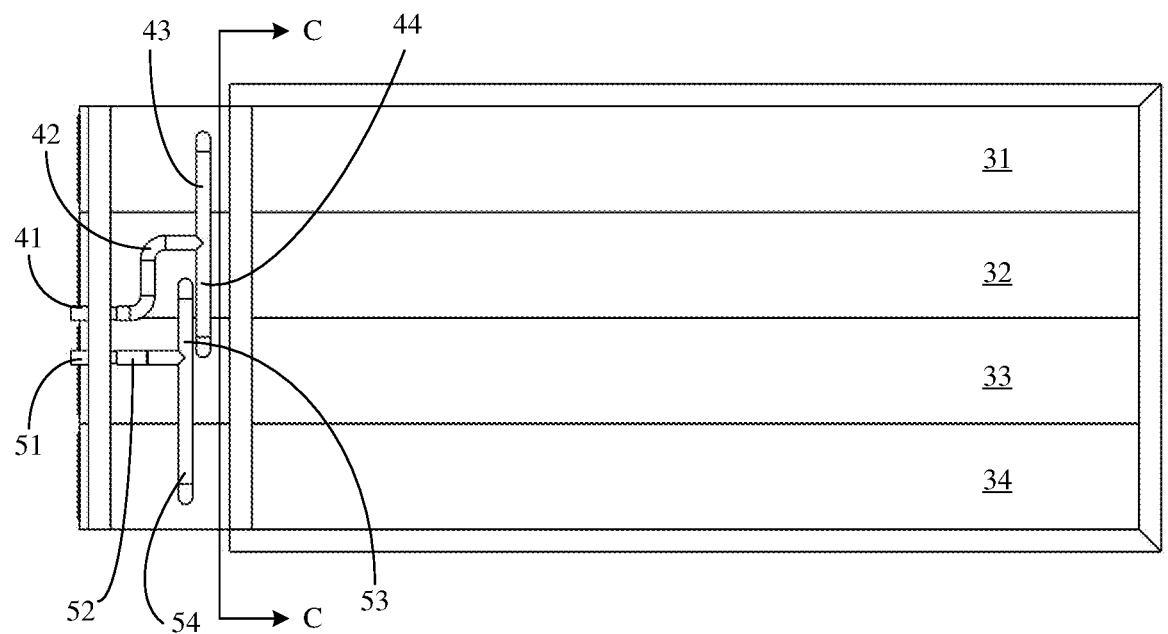
FIG. 3 is a schematic view of the cooling device of FIG. 2 as seen from top.

As shown in FIG. 3, the liquid cooling plate assembly 30 includes a plurality of liquid cooling plates arranged side by side and sealingly connected with each other, and each liquid cooling plate is provided with flow passages. In the illustrated embodiment, four liquid cooling plates are exemplarily shown, that is, a first liquid cooling plate 31, a second liquid cooling plate 32, a third liquid cooling plate 33, and a fourth liquid cooling plate 34. These liquid cooling plates are integrally formed with each other for example by welding such as friction stir welding or metal inert-gas welding (MIG). It should be understood that in practical applications, more or less liquid cooling plates may be provided as needed.

Figure 4:
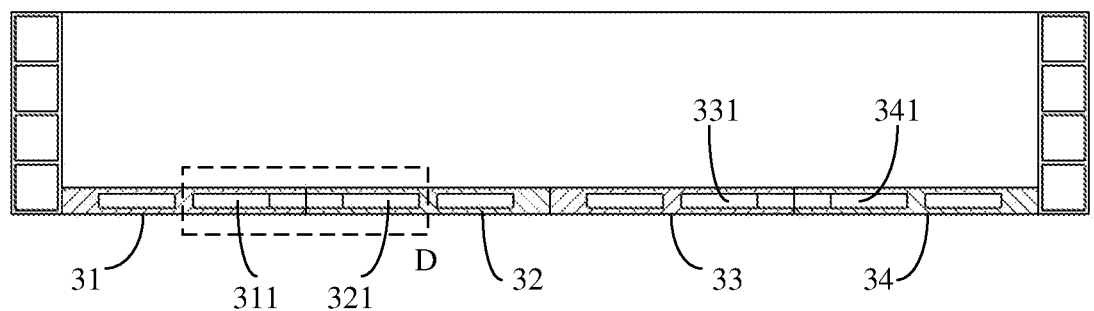
FIG. 4 is a schematic cross-sectional view taken along line C-C of FIG. 3.

Advantageously, one or more adjacent liquid cooling plates are in fluid communication with each other to form a cooling circuit. In certain embodiments, sides of the one or more liquid cooling plates constituting the cooling circuit are provided with slots to achieve fluid communication between the liquid cooling plates. The slots are preferably provided at the second region 20. As shown in FIGS. 3 and 4, the first liquid cooling plate 31 and the second liquid cooling plate 32 may be in fluid communication with each other by slots 311, 321 respectively provided thereon, and the third liquid cooling plate 33 and the fourth liquid cooling plate 34 may be in fluid communication with each other by slots 331, 341 respectively provided thereon. In other words, the first liquid cooling plate 31 and the second liquid cooling plate 32 are connected in series, and are connected in parallel with the third liquid cooling plate 33 and the fourth liquid cooling plate 34 which are also connected in series, thereby forming, for example, two S-shaped structures with their head ends communicated and their tail ends communicated, in order to ensure the uniformity of the temperature field distribution of the liquid cooling plates, effectively reduce the pressure drop of the system, and improve heat dissipation effect.

Figure 5:
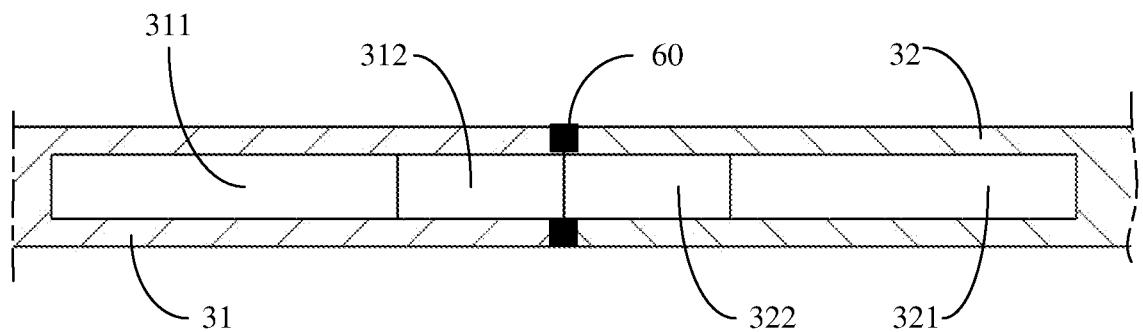
FIG. 5 is an enlarged schematic view of a portion D of FIG. 4.

As described above, the liquid cooling plates are connected by welding. When slots are provided to fluidly communicate two or more liquid cooling plates, welding penetration needs to be controlled during the welding process to prevent welds from blocking the flow passages. As shown in FIG. 5, especially at the positions of the slots, the penetration of a weld 60 is advantageously controlled to be substantially equal to the thickness of a wall of the liquid cooling plate.

Returning to FIG. 3, in the illustrated embodiment, the piping system includes a liquid inlet pipe 40 and a liquid outlet pipe 50. The liquid inlet pipe 40 is in fluid communication with one or more liquid cooling plates and connected to a liquid supply pipe via a liquid inlet joint 41, and the liquid outlet pipe 50 is in fluid communication with one or more liquid cooling plates and connected to a liquid discharge pipe via a liquid outlet joint 51. In the case where the liquid cooling plate assembly adopts the above arrangement of the four liquid cooling plates, and two liquid cooling plates are connected in series and connect in parallel with the other two liquid cooling plates which also connected in series, the liquid inlet pipe 40 may include a liquid inlet main pipe 42 communicated with the liquid inlet joint 41, a first liquid inlet branch pipe 43 communicated with the first liquid cooling plate 31 and a second liquid inlet branch pipe 44 communicated with the third liquid cooling plate 33; and accordingly, the liquid outlet pipe 50 may include a liquid outlet main pipe 52 communicated with the liquid outlet joint 51, a first liquid outlet branch pipe 53 communicated with the second liquid cooling plate 32 and a second liquid outlet branch pipe 54 communicated with the fourth liquid cooling plate 34. A tee joint may be provided at the junction of the liquid inlet main pipe 42, the first liquid inlet branch pipe 43 and the second liquid inlet branch pipe 44 to dividing liquid flow. Similarly, a tee joint may also be provided at the junction of the liquid outlet main pipe 52, the first liquid outlet branch pipe 53 and the second liquid outlet branch pipe 54. Through dividing liquid flow by the pipes, the flow can be distributed to each liquid cooling plate as required.

Figure 6:
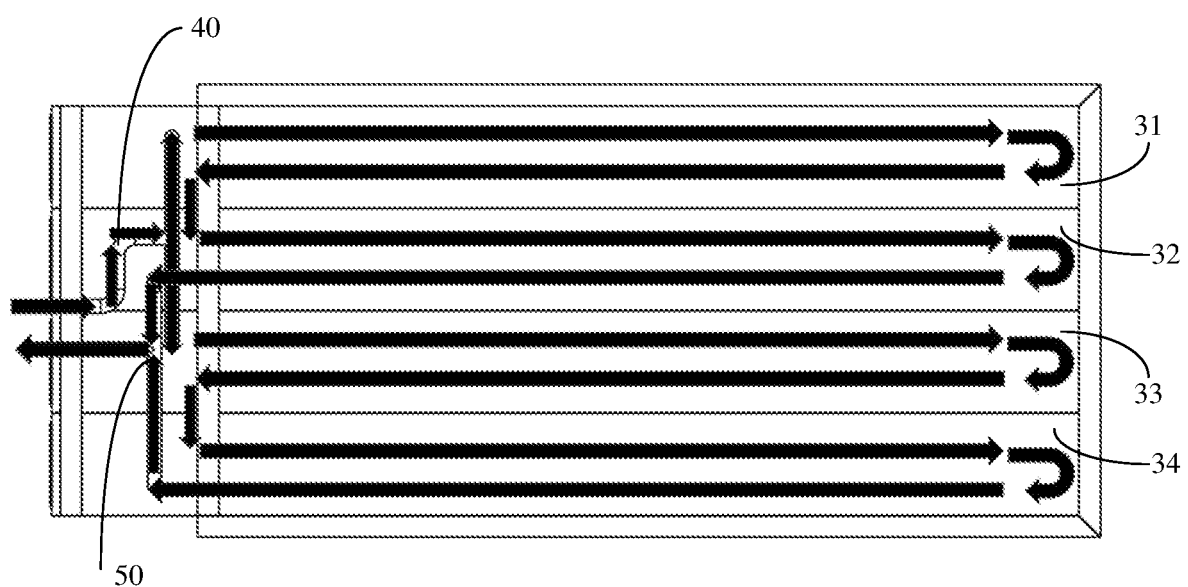
FIG. 6 is a schematic view similar to FIG. 3, showing the flow direction of a coolant.

During the cooling process of the cooling device, the coolant flows as indicated by arrows in FIG. 6. The coolant respectively enters the first liquid cooling plate 31 and the third liquid cooling plate 33 from the liquid inlet joint along the first liquid inlet branch pipe and the second liquid inlet branch pipe, passes through the S-shaped flow passages, and flows to the liquid outlet joint respectively from the second liquid cooling plate 32 and the fourth liquid cooling plate 34 via the first liquid outlet branch pipe 53 and the second liquid outlet branch pipe 54, thereby achieving the purpose of circulation cooling, and ensuring that the power batteries operate in an environment where the temperature is substantially constant.

In the cooling device for the power battery system of the present disclosure, a sealing range of the casing is composed of the vertical plates constituting the first region 10 and the liquid cooling plate assembly 30, and the piping system 40, 50 is disposed in the second region 20 outside the sealing range. Thus, battery cells, high-voltage devices and the like in the battery casing would not be affected even if a coolant leakage accident occurs. In some embodiments, flow passages between the liquid cooling plates connected in series are also arranged outside the sealing range of the casing, so that even if the coolant leaks due to welding defects or extrusion tests, components in the casing would not be affected, thereby improving the safety and reliability of the system.

It should be understood that the embodiment shown in FIGS. 1 to 6 only shows the optional shape, size and arrangement of the cooling device according to the present disclosure, and it is merely illustrative and not restrictive. Other shapes, sizes and arrangements may also be adopted without departing from the concept and scope of the present disclosure.

Technical contents and technical features of the present disclosure have been disclosed above. However, it should be understood that those skilled in the art can make various changes and improvements to the above disclosed concepts under the creative idea of the present disclosure, and all the changes and improvements belong to the scope of protection of the present disclosure. The description of the above embodiments is illustrative and not restrictive, and the scope of the present disclosure is defined by the claims.

What is claimed is:

1. A cooling device for a power battery system, wherein the cooling device is disposed at a bottom of the power battery system and comprises a chamber defined by a casing, and the chamber comprises:
    a first region where a liquid cooling plate assembly is disposed; and
    a second region sealingly separated from the first region and accommodating a piping system for coolant communication;
    wherein the liquid cooling plate assembly extends from a bottom of the first region to a bottom of the second region, and the piping system is in fluid communication with a flow passage of the liquid cooling plate assembly;
    wherein the liquid cooling plate assembly comprises a plurality of liquid cooling plates arranged side by side and sealingly connected with each other, and one or more adjacent liquid cooling plates are in fluid communication to form a cooling circuit;
    wherein sides of the one or more liquid cooling plates constituting the cooling circuit are provided with slots to achieve a fluid communication between the liquid cooling plates, and the slots are disposed at the second region; and
    wherein the plurality of liquid cooling plates comprises four liquid cooling plates, wherein the first liquid cooling plate and the second liquid cooling plate are in fluid communication with each other by slots respectively provided thereon, the third liquid cooling plate and the fourth liquid cooling plate are in fluid communication with each other by slots respectively provided thereon, such that the first liquid cooling plate and the second liquid cooling plate are connected in series, and are connected in parallel with the third liquid cooling plate and the fourth liquid cooling plate which are also connected in series.

2. The cooling device for a power battery system according to claim 1, wherein the piping system comprises a liquid inlet pipe and a liquid outlet pipe; the liquid inlet pipe is in fluid communication with the one or more liquid cooling plates and connected to a liquid supply pipe via a liquid inlet joint; and the liquid outlet pipe is in fluid communication with the one or more liquid cooling plates and connected to a liquid discharge pipe via a liquid outlet joint.

3. The cooling device for a power battery system according to claim 1, wherein the first region is defined by a plurality of vertical plates perpendicular to the liquid cooling plate assembly; the plurality of vertical plates are sealingly connected to the liquid cooling plate assembly; and the power battery system is disposed in the first region and supported by the liquid cooling plate assembly.

4. The cooling device for a power battery system according to claim 3, wherein the second region is sealingly separated from the first region by the plurality of vertical plates, and the second region further comprises an enclosure side plate through which the piping system extends.

5. The cooling device for a power battery system according to claim 1, wherein the plurality of liquid cooling plates are sealingly connected by friction stir welding.

6. A power battery system for a vehicle, wherein the power battery system comprises at least one cooling device for a power battery system, wherein the least one cooling device is disposed at a bottom of the power battery system and comprises a chamber defined by a casing, and the chamber comprises:
    a first region where a liquid cooling plate assembly is disposed; and
    a second region sealingly separated from the first region and accommodating a piping system for coolant communication;
    wherein the liquid cooling plate assembly extends from a bottom of the first region to a bottom of the second region, and the piping system is in fluid communication with a flow passage of the liquid cooling plate assembly;
    wherein the liquid cooling plate assembly comprises a plurality of liquid cooling plates arranged side by side and sealingly connected with each other, and one or more adjacent liquid cooling plates are in fluid communication to form a cooling circuit; and
    wherein sides of the one or more liquid cooling plates constituting the cooling circuit are provided with slots to achieve a fluid communication between the liquid cooling plates, and the slots are disposed at the second region; and wherein the plurality of liquid cooling plates comprises four liquid cooling plates, wherein the first liquid cooling plate and the second liquid cooling plate are in fluid communication with each other by slots respectively provided thereon, the third liquid cooling plate and the fourth liquid cooling plate are in fluid communication with each other by slots respectively provided thereon, such that the first liquid cooling plate and the second liquid cooling plate are connected in series, and are connected in parallel with the third liquid cooling plate and the fourth liquid cooling plate which are also connected in series.

7. A vehicle comprising a power battery system, wherein the power battery system comprises at least one cooling device for a power battery system, wherein the least one cooling device is disposed at a bottom of the power battery system and comprises a chamber defined by a casing, and the chamber comprises:
- a first region where a liquid cooling plate assembly is disposed; and
- a second region sealingly separated from the first region and accommodating a piping system for coolant communication;
- wherein the liquid cooling plate assembly extends from a bottom of the first region to a bottom of the second region, and the piping system is in fluid communication with a flow passage of the liquid cooling plate assembly;
- wherein the liquid cooling plate assembly comprises a plurality of liquid cooling plates arranged side by side and sealingly connected with each other, and one or more adjacent liquid cooling plates are in fluid communication to form a cooling circuit;
- wherein sides of the one or more liquid cooling plates constituting the cooling circuit are provided with slots to achieve a fluid communication between the liquid cooling plates, and the slots are disposed at the second region; and
- wherein the plurality of liquid cooling plates comprises four liquid cooling plates, wherein the first liquid cooling plate and the second liquid cooling plate are in fluid communication with each other by slots respectively provided thereon, the third liquid cooling plate and the fourth liquid cooling plate are in fluid communication with each other by slots respectively provided thereon, such that the first liquid cooling plate and the second liquid cooling plate are connected in series, and are connected in parallel with the third liquid cooling plate and the fourth liquid cooling plate which are also connected in series.

8. The cooling device for a power battery system according to claim 3, wherein the second region is sealingly separated from the first region by the plurality of vertical plates, and the second region further comprises a cover plate.

9. The cooling device for a power battery system according to claim 1, wherein the plurality of liquid cooling plates are sealingly connected by metal inert-gas welding.

* * * * *